United States Patent
Nagata

(10) Patent No.: US 7,638,401 B2
(45) Date of Patent: Dec. 29, 2009

(54) MEMORY DEVICE WITH SURFACE-CHANNEL PERIPHERAL TRANSISTORS

(75) Inventor: Toshiyuki Nagata, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/972,048

(22) Filed: Jan. 10, 2008

(65) Prior Publication Data

US 2008/0108191 A1    May 8, 2008

Related U.S. Application Data

(62) Division of application No. 10/287,571, filed on Nov. 4, 2002, now Pat. No. 7,339,220, which is a division of application No. 09/178,470, filed on Oct. 23, 1998, now Pat. No. 6,486,023.

(60) Provisional application No. 60/063,965, filed on Oct. 31, 1997.

(51) Int. Cl.
*H01L 29/10* (2006.01)

(52) U.S. Cl. .................. 438/301; 438/302; 438/305; 257/296; 257/E21.648; 257/21.66; 257/E27.089; 257/E27.097

(58) Field of Classification Search .................. 257/296
See application file for complete search history.

(56) References Cited

U.S. PATENT DOCUMENTS

2002/0027259 A1 *  3/2002  Ikemasu et al. ............. 257/499

* cited by examiner

*Primary Examiner*—Zandra Smith
*Assistant Examiner*—Tsz K Chiu
(74) *Attorney, Agent, or Firm*—Wade J. Brady, III; Frederick J. Telecky, Jr.

(57) ABSTRACT

A method of forming a memory device (e.g., a DRAM) including array and peripheral circuitry. A plurality of undoped polysilicon gates 58 are formed. These gates 58 are classed into three groups; namely, first conductivity type peripheral gates 58p, second conductivity type peripheral gates 58n, and array gates 58a. The array gates 58a and the first conductivity type peripheral gates 58n are masked such that the second conductivity type peripheral gates 58p remain unmasked. A plurality of second conductivity type peripheral transistors can then be formed by doping each of the second conductivity type peripheral gates 58p, while simultaneously doping a first and a second source/drain region 84 adjacent each of the second conductivity type peripheral gates 58p. The second conductivity type peripheral gates 58p are then masked such that the first conductivity type peripheral gates 58n remain unmasked. A plurality of first conductivity type peripheral transistors are formed by doping each of the first conductivity type peripheral gates 58n, while simultaneously doping a first and a second source/drain region 82 adjacent each of the first conductivity type peripheral gates 58n.

14 Claims, 12 Drawing Sheets

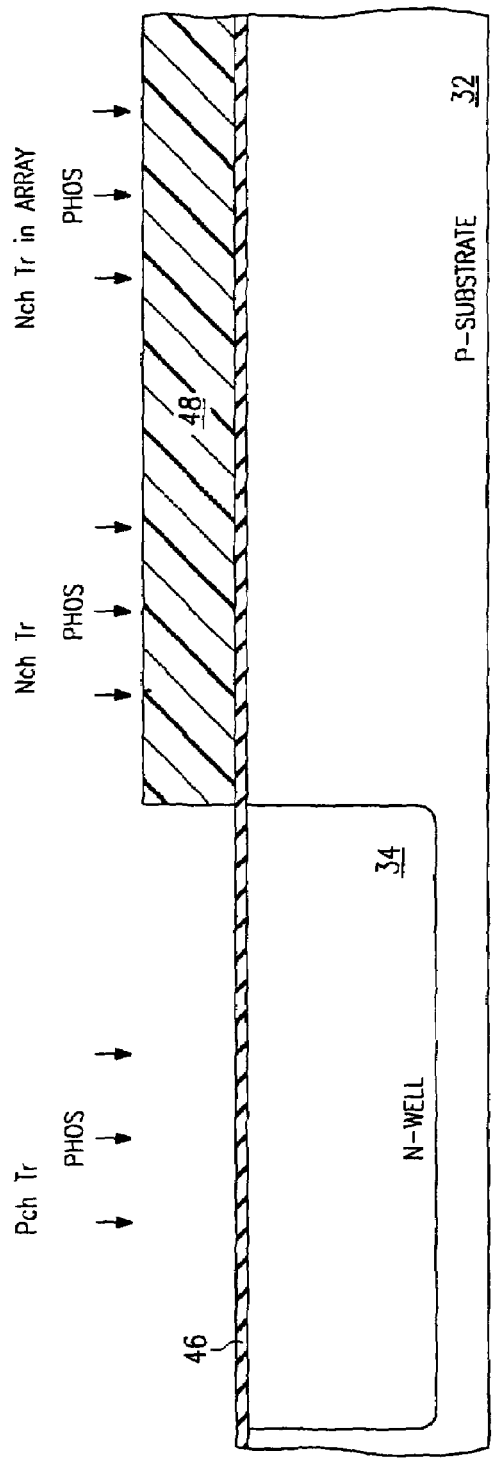
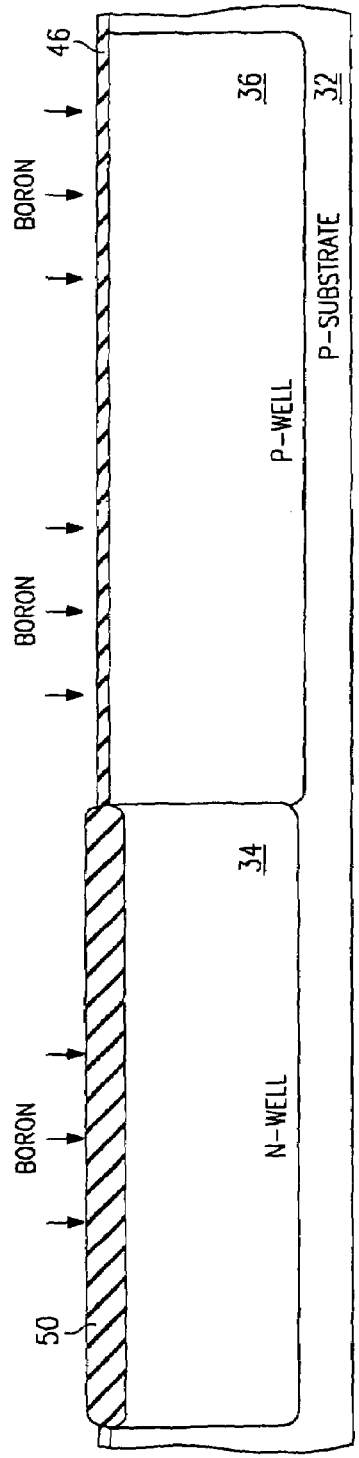
FIG. 4
FIG. 5

MEMORY DEVICE WITH SURFACE-CHANNEL PERIPHERAL TRANSISTORS

This application is a divisional application of application Ser. No. 10/287,571 filed on Nov. 4, 2002 now U.S. Pat. No. 7,339,220 which is a divisional application of U.S. patent application Ser. No. 09/178,470, filed on Oct. 23, 1998 (now U.S. Pat. No. 6,486,023 issued on Nov. 26, 2002) which claims the benefit of U.S. Provisional Application No. 60/063,965 filed on Oct. 31, 1997 (now abandoned) entitled Method Device With Surface-Channel Peripheral Transistors.

FIELD OF THE INVENTION

Background of the Invention

The manufacture of integrated circuits generally, and dynamic random access memories (DRAMs) particularly, involves hundreds of individual manufacturer or process steps. While any generalization of such a large number of operations necessarily omits much detail, the manufacture of integrated circuits can be generally described with four major divisions: prepare blank wafers of semiconductor material, such as silicon; process the blank wafers to form multiple chips containing the desired circuits; package the individual chips and subject the packaged chips to elevated temperature and voltage operating conditions to eliminate early failing chips, e.g. perform burn-in testing. This last step helps ensure reliability.

To reduce the cost of memory devices, efforts are continuously being made to reduce the number of manufacturing or process steps required to fabricate devices. One objective of cost reduction has been addressed by the DRAM industry in the form of mask reduction; that is, attempting to fabricate the desired DRAM design, while using fewer costly photolithographic steps.

Complementary metal-oxide-semiconductor (CMOS) is the most common technology used to form DRAM devices. As is known, CMOS circuits include both n-channel and p-channel transistors. The choice of the gate material and the channel doping level determines the threshold voltage for the transistors. For enhanced performance of the devices, it is desirable that the threshold voltages of the n- and p-channel transistors are comparable, and preferably, of equal magnitude. It is also desirable that the threshold voltages are as low as possible without introducing excessive off-state current.

The most common choice for gate material for modern CMOS technologies is n-type polysilicon that is doped heavily enough to make the polysilicon degenerate. This is usually combined with a silicide layer to lower the sheet resistance. The work function of $n^+$ polysilicon is ideal for an n-channel device since it yields a threshold voltage of less than 0.7 V for reasonable values of channel doping and oxide thickness.

When the $n^+$ polysilicon gate is used, the p-channel threshold voltage is not as ideally adjusted with the substrate doping. The threshold voltage of the p-channel device is adjusted by simply reducing the p-channel substrate doping. For doping levels necessary to prevent short-channel effects, the threshold voltage magnitude is above 1 V.

A technique that allows the p-channel threshold voltage to be adjusted to the desired level is to implant a shallow boron layer into the channel region. The boron shifts the threshold voltages towards more positive values by forming a compensating layer. The boron threshold adjustment can also be used to raise the threshold voltage of the n-channel transistor. A single boron implant dose can be used to set the threshold voltages of both the n- and p-channel transistors if the background dopings are chosen correctly. The magnitude of $V_{TP}$, the threshold voltage of the p-channel transistor, is reduced because the boron implant charge to the channel region of the n-well. Lower n-well doses allow the boron implant to have a greater effect on the value of $V_{TP}$. One disadvantage to this approach is that the p-channel transistor is more susceptible to short-channel effects with the compensated surface channel.

Another choice for the gate material is $p^+$-polysilicon. The work function of $p^+$ polysilicon is about 1.1V greater than for $n^+$ polysilicon. This makes it ideal for the p-channel transistor in terms of having the threshold voltage easily adjusted to −0.7 V or less with channel doping of $10^{15}$ to $10^{17}$ cm$^{-3}$. However, the n-channel transistor must now be compensated to reduce the threshold voltage to reasonably low values.

Other choices of gate material, such as $MoSi_2$, have metal work functions that are between those of $n^+$ and $p^+$ polysilicon, which allows both transistors to be slightly compensated to get the desired threshold voltages. To optimize both devices simultaneously, both $n^+$- and $p^+$-type polysilicon gates can be used for the n- and p-channel transistors respectively. This approach allows both transistor threshold voltages to be easily adjusted to the desired threshold voltages without sacrificing short-channel effects, but adds to the processing complexity. See S. M. Sze, *VLSI Technology*, McGraw-Hill, New York, 1988, Ch. 11, pp. 483-493.

SUMMARY OF THE INVENTION

The present invention discloses a memory device which can be manufactured in fewer process steps than prior art memory devices. An array of memory cells, such as DRAM cells, is formed in a semiconductor chip. Peripheral circuitry (e.g., decoders, buffers, voltage generators) is disposed adjacent the array. The peripheral circuitry includes both n-channel transistors and p-channel transistors. Each of the n-channel transistors includes a polysilicon gate doped with n-type impurities while each of the p-channel transistors includes a polysilicon gate doped with p-type impurities.

The present invention further provides a method of forming a memory device including array and peripheral circuitry. A plurality of undoped polysilicon gates are formed. These gates may be classed into three groups; namely, first conductivity type peripheral gates, second conductivity type peripheral gates, and array gates. The array gates and the first conductivity type peripheral gates are masked such that the second conductivity type peripheral gates remain unmasked. A plurality of second conductivity type peripheral transistors can then be formed by doping each of the second conductivity type peripheral gates while simultaneously doping a first and a second source/drain region adjacent each of the second conductivity type peripheral gates. The second conductivity type peripheral gates are then masked such that the first conductivity type peripheral gates remain unmasked. As before, a plurality of first conductivity type peripheral transistors are formed by doping each of the first conductivity type peripheral gates while simultaneously doping a first and a second source/drain region adjacent each of the first conductivity type peripheral gates.

One advantage of the present invention is the elimination of ion implantation steps to control the threshold voltage in the p-channel peripheral transistors. Since the p-channel transistors have p-doped polysilicon gates, no threshold voltage adjustment is necessary. This feature shortens the length of the memory device manufacturing process.

BRIEF DESCRIPTION OF THE DRAWINGS

The above features of the present invention will be more clearly understood from consideration of the following descriptions in connection with accompanying drawings in which:

FIG. 1b is a schematic diagram of a portion of the memory array shown in FIG. 1a;

FIGS. 4-21 are cross-sectional views of a device at various stages in a manufacturing process in accordance with a preferred embodiment of the invention.

DETAILED DESCRIPTION OF ILLUSTRATIVE EMBODIMENTS

In one aspect, the present invention relates to a memory device in which the peripheral circuitry is formed with fewer process steps. The present invention is described in conjunction with a dynamic random access memory (DRAM). Note, however, that the inventive principles of the present invention could be applied to other semiconductor devices including other memory devices such as non-volatile memories (flash, EPROM, EEPROM) or static random access memories.

Figure 1A:
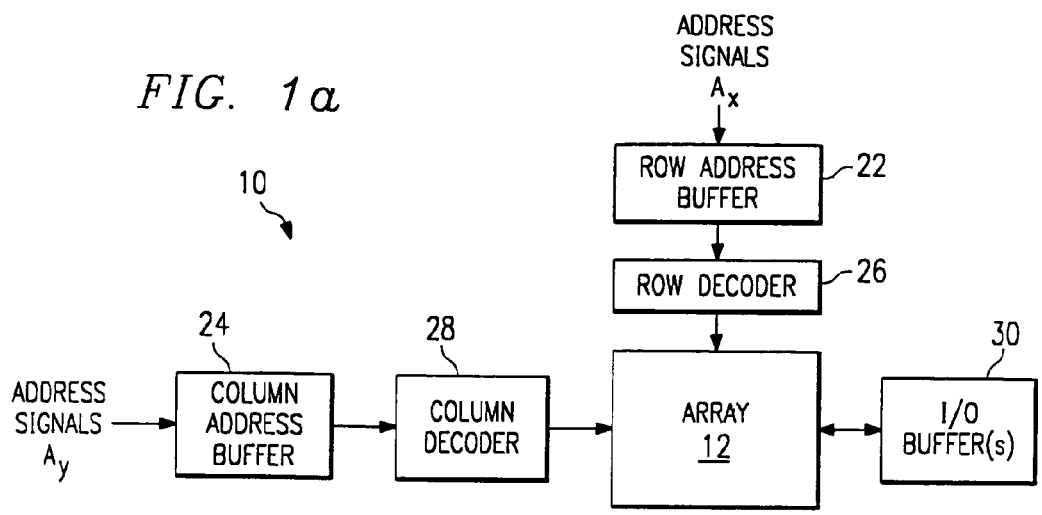
FIG. 1a is a block diagram of a memory device in accordance with an embodiment of the invention.
Figure 1B:
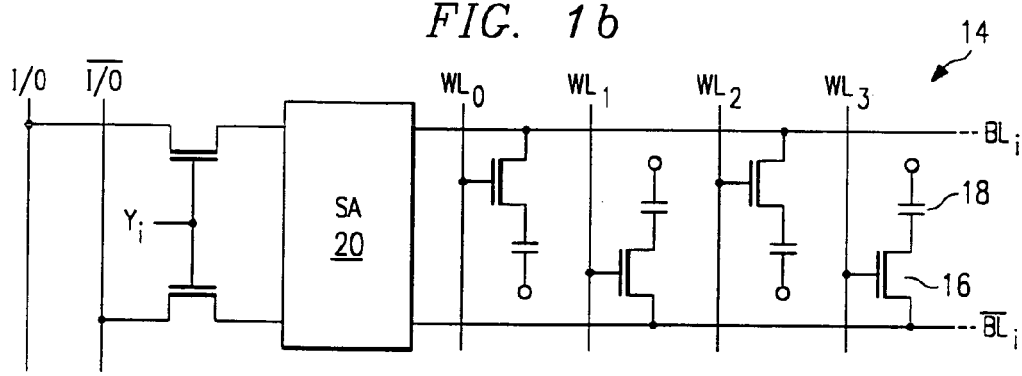

A general overview of a DRAM device 10 is illustrated in FIGS. 1a and 1b. While FIGS. 1a and 1b may appear to be the same as prior art devices, the unique structure of the CMOS peripheral circuitry makes this device novel. The details of this novelty will become apparent with the discussion below. DRAM 10 shown in FIG. 1a is only a very simplified example of a memory device. Many other details and complexities are not shown. This memory device 10 can be a stand-alone integrated circuit or be embedded on an integrated circuit with other circuitry.

Memory array 12 includes a plurality of rows and columns of memory cells. FIG. 1b illustrates a portion of one column 14 of memory cells. Each DRAM memory cell includes a pass transistor 16 coupled in series with a storage capacitor 18. The gate of each pass transistor 16 is coupled to a word line WL. Each of the word lines WL will extend over a number of columns 14 (only one of which is illustrated). The pass transistor 16 is also coupled between the storage capacitor 18 and a bit line BL (or the complement of BL, BL(bar)). The bit lines BL and BL(bar) are each coupled to a sense amplifier 20.

Referring now to FIG. 1a, along with FIG. 1b, address signals $A_x$ and $A_y$ are used to select a particular memory cell. Row address buffer 22 stores row addresses $A_x$, while the column address buffer 24 stores column addresses $A_y$. These buffers find particular use if the addresses are multiplexed on a single set of external pins. For other memory configurations, such as embedded memories for example, the address buffers 22 and 24 may not be needed. The operation of the device can be synchronized with an internal or external clock (not shown) or may be asynchronous.

The row address is applied to row decoder 26 which decodes the address and selects one of the word lines WL. Several levels of decoding may be used. The information stored in the storage capacitor 18 of those selected memory cells is then sensed by sense amplifier 20. One or more of the columns is selected by column-select signal $Y_i$ which couples the sense amplifier 20 of the selected couple to input/outline lines I/O. The column select signal $Y_i$ is derived by the column decoder 28. The input/output lines I/O are then coupled to I/O buffers 30.

Figure 2:
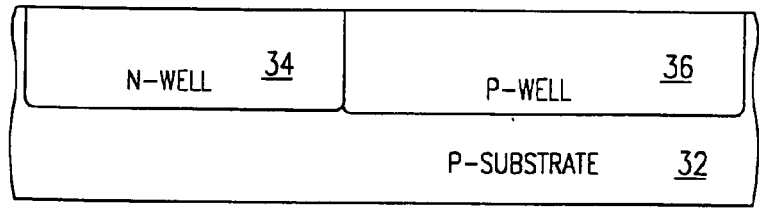
FIG. 2 is a cross-sectional view of a substrate with an n-well and a p-well.
Figure 21:
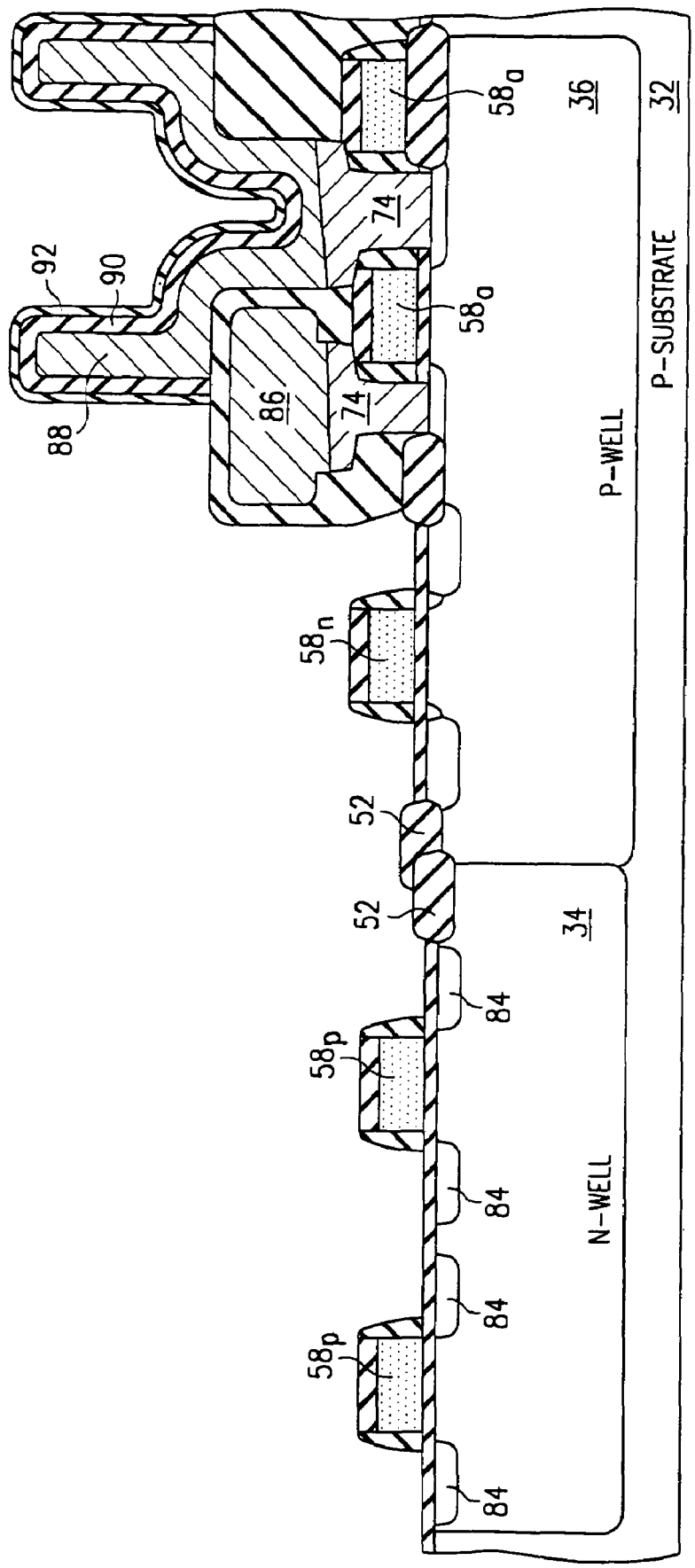

FIG. 2 illustrates a portion of the substrate 32 within which the memory device 10 can be formed. In this example, the substrate 32 is a p-doped monocrystalline silicon substrate. An n-well 34 is formed within the substrate 32. The p-channel peripheral circuitry (not shown in FIG. 2, see FIG. 21) is to be formed within n-well 34. A p-well 36 is also formed within the substrate 32. Both the n-channel peripheral circuitry and the array circuitry can be formed in p-well 36 (as illustrated in FIG. 21). (While illustrated throughout as a single n-well 34 or p-well 36, it should be understood that many n-wells and p-wells will be disposed in various places within the chip as required by the layout of the specific circuitry.)

In this context, the peripheral circuitry includes any circuits outside of the array 12. Referring to FIG. 1a for example, address buffers 22, 24, decoders 26, 28 and data buffers 30 are all part of the peripheral circuitry. Other circuits that are not shown would also be included. For example, a DRAM device may include clock circuitry, refresh circuitry, redundancy circuitry, voltage generators, test circuitry, and other peripheral circuits. In this context, sense amplifiers 20 are considered peripheral circuits.

As is known, many of the peripheral circuits can be formed using CMOS technology. CMOS circuitry is well known in the art. For the sake of simplicity, specific individual circuits are not shown here. Any number of a wide variety of CMOS circuits can be used with the present invention.

In one manner of forming a DRAM device, the CMOS peripheral circuitry can be formed from surface-channel n-type transistors and buried-channel p-type transistors. In general, n-type polysilicon is used for doping the gates of both conductivity type transistors. In the case of n-type transistors, a lower threshold voltage is easily achieved because of the difference of work function between the n-type gate and the p-type substrate (or well). In the case of p-type transistors, however, it is difficult to design a lower threshold voltage because both the well and the gate are formed from n-type silicon material. Therefore, as described above, the threshold voltage of a p-type transistor is designed lower by using a buried-channel-type transistor.

Figure 3:
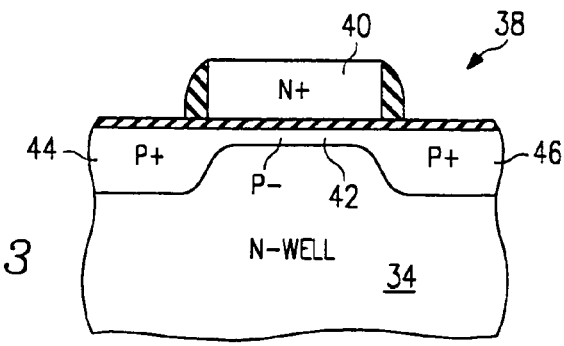
FIG. 3 is a cross-sectional view of a buried-channel-type transistor.

An example of a buried-channel-type transistor 38 is shown in FIG. 3. Transistor 38 includes an n-doped polysilicon gate 40 which overlies a lightly p-doped channel region 42. Heavily doped source/drain regions 44 and 46 complete the buried-channel-type transistor 38.

In one aspect, the present invention provides a memory device which does not require buried-channel-type transistors. Referring to FIG. 1a, the memory device 10 includes an array 12 of memory cells disposed in rows and columns. Peripheral circuitry is disposed adjacent the array. The peripheral circuitry including both n-channel transistors and p-channel transistors. In a preferred embodiment, the n-channel transistors include polysilicon gates doped with n-type impurities while the p-channel transistors include polysilicon gates doped with p-type impurities.

Using the preferred embodiment DRAM manufacturing process, it is possible to form p-channel transistors with surface channels and thereby eliminate the need for an ion implantation process to control the threshold voltage ($V_t$) of the p-channel transistor. Namely, the p-channel transistor comprises a surface-channel-type transistor instead of a buried-channel-type transistor. Therefore, it is possible to eliminate ion implantation to control $V_t$ of p-type transistor, and replace this step with an ion implantation of each well for improving device isolation. These steps can simplify the manufacturing process of a DRAM or similar circuit. Also, the formation of the periphery n-channel transistors can be achieved without affecting the implanted source and drain regions of the array pass transistors since the storage node contact and the bit line contact pads cover the source and drain regions of the pass transistors during the implant to make undoped n-channel transistor poly gates into n+ gates.

The specific details of the preferred process for forming a DRAM device are described below with respect to FIGS. 4-21. While these figures illustrate one specific process flow, it should be understood that variations are possible.

Each of FIGS. 4-21 illustrate the simultaneous fabrication of two p-type peripheral transistors, one n-type peripheral transistor, and one memory cell (along with the word line or pass gate for a memory cell in a different column). The specific cross-sections are merely illustrative of the three types of transistors that are being simultaneously fabricated. It should be understood that a cross-section may not actually include the specific circuitry shown. Specifically, the relative locations of these transistors may vary. A single well may, in practice, include one or more transistor. A memory array active area usually includes two memory cells (sharing a single bit line).

Referring first to FIG. 4, the n-well 34 is formed in p-substrate 32. The embodiment of FIG. 4 includes a lightly-doped p-type silicon substrate 32. In one example, substrate 32 may comprise a P(100) substrate with a resistivity of about 9 to 12 ohm-cm with a 4-degree offset. In other embodiments, however, the substrate material may change. For example, an n-type substrate could be used. As another example, a memory device can be formed in an epitaxial layer (not shown) formed over the substrate 32 or over an insulating layer (not shown). If an epitaxial layer is used, the doping of substrate 32 may be changed.

The n-well 34 is formed by first forming a pad oxide 46 over the substrate 32. In the preferred embodiment, pad oxide 46 is about 23 nm and is thermally grown. Photoresist layer 48 is then applied to the device and patterned and etched so as to expose the n-well 34. N-well 34 can then be formed by doping of n-type impurities such as phosphorus or arsenic. For example, a dose of about $2\times10^{13}$ cm$^{-2}$ phosphorus ions at about 500 keV can be followed by a dose of about $5\times10^{12}$ cm$^{-2}$ phosphorus ions at about 250 keV. In another embodiment, the n-well 34 dose and energy conditions are $1\times10^{13}$ cm$^{-2}$ and 120 keV, respectively.

Referring next to FIG. 5, p-well 36 is formed. In some embodiments, it is possible to form the p-well 36 prior to forming the n-well 34. To form p-well 36, a thick oxide 50 is formed over n-well 34. In the preferred embodiment, tank oxide 50 is about 150 nm thick. Pad oxide 46 can remain over the p-well region. P-well 36 can be formed by implanting p-type dopants into the portions of substrate 32 that are not masked by thick oxide 50. In the preferred embodiment, boron is implanted with a dose of about $1\times10^{13}$ cm$^{-2}$ and an energy of about 60 keV.

An alternative embodiment, which is not illustrated, can utilize a triple well structure. In this device, a portion of p-well 36 is formed within an n-well (not shown). The memory array transistors can then be formed within this well region. The triple well structure is useful if the peripheral circuitry is to be operated at a different substrate bias than the array circuitry. For example, the peripheral circuitry may operate with a substrate bias at ground (e.g., $V_{SS}$) while the array has a substrate bias of about −1 to −2 volts (e.g., $V_{BB}$).

Figure 6:
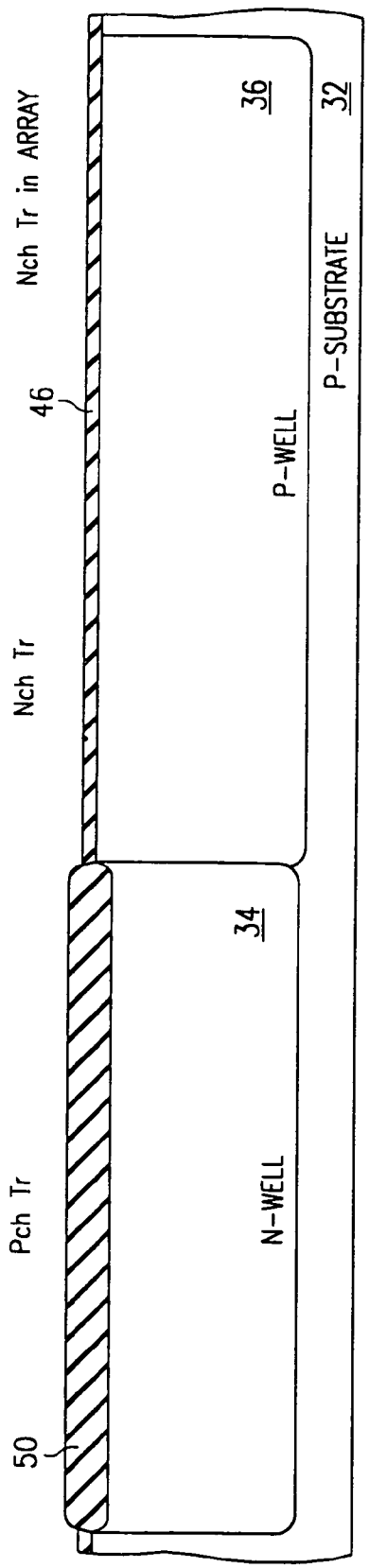

Referring to FIG. 6, the device can be annealed to drive in the n-well 34 and p-well 36 dopants by heating the wafer to a temperature of about 900° C. for about 500 minutes, for example.

Figure 7:
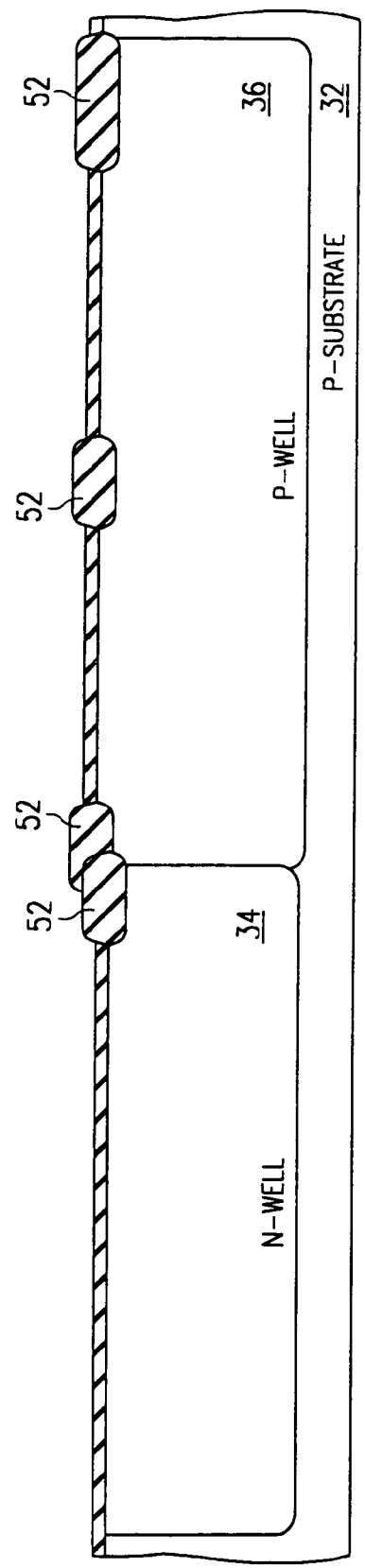

Referring now to FIG. 7, field isolation regions 52 are formed. Other forms of isolation, such as trench isolation or field-plate isolation, can alternatively be used. In the preferred embodiment, field isolation regions 52 are formed by the local oxidation of silicon (LOCOS) process. This process creates 400 nm device isolation regions.

Figure 8:
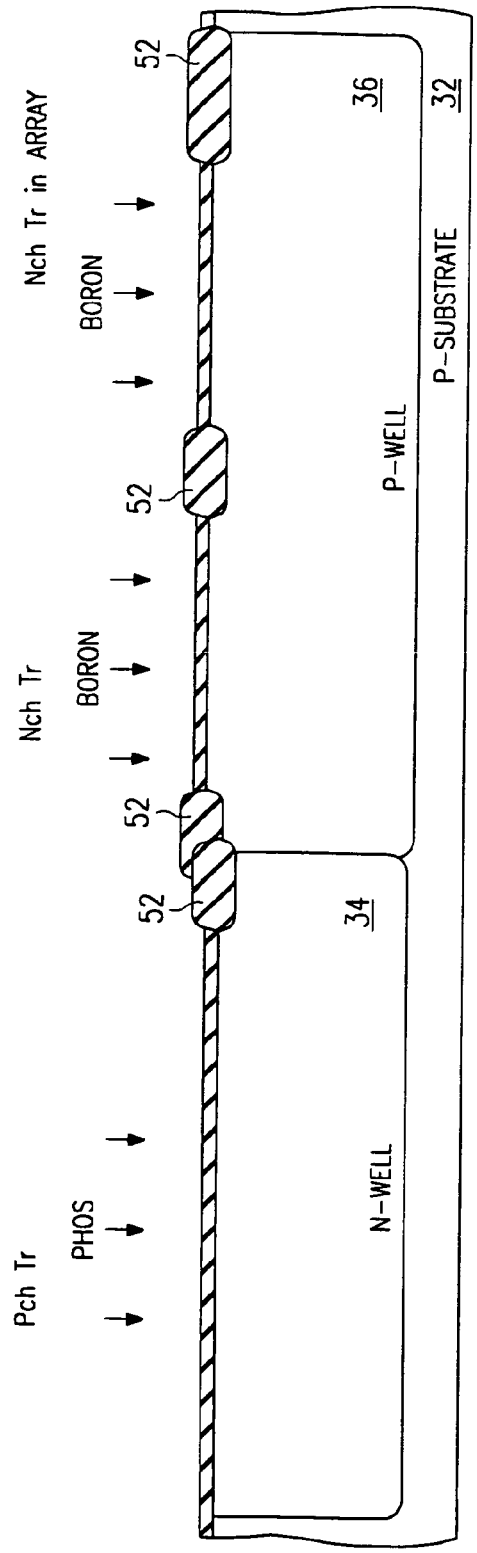

Referring next to FIG. 8, n-type dopants (e.g., phosphorus or arsenic) are implanted into n-well 34 and then p-type dopants (e.g., boron) are implanted into p-well 36. This step can be performed by forming a patterned resist layer (not shown) over p-well 36 while implanting into n-well 34 and then, after removing that resist layer, forming a second patterned resist layer (not shown) over n-well 34 and then implanting into p-well 36. The order of implantation steps can be reversed. This implant is performed through LOCOS regions 52 so as to improve device isolation. In the preferred embodiment, phosphorus is implanted with an energy of 250 KeV and a dose of $5\times10^{12}$ cm$^{-2}$ and boron is implanted with an energy of 180 KeV and a dose of $2\times10^{12}$ cm$^{-2}$.

Figure 9:
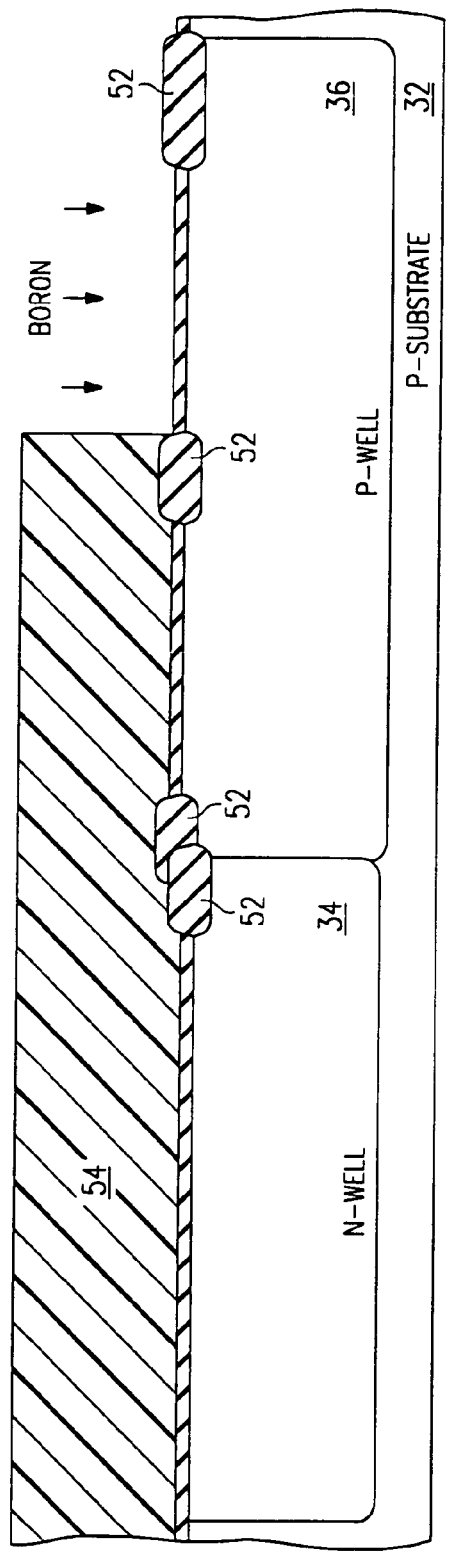

Referring next to FIG. 9, a threshold voltage ($V_t$) adjust implant can be performed in the array portion of the device. A patterned resist layer 54 is formed over the periphery so as to expose the array portion of the device. P-type impurities can then be implanted into the top surface of the memory array to control the threshold voltage. In the preferred embodiment boron is implanted with an energy of about 120 KeV and a dose of about $2.8\times10^{12}$ cm$^{-2}$.

Note that this process flow does not require ion implantation to control the threshold voltage of either the n-type peripheral transistors or the p-type peripheral transistors. The elimination of these steps provides one of the advantages of the present invention. Prior art processes that make use of $V_t$ implants typically require two more photolithography steps. Since photolithography steps tend to be a production bottleneck, the elimination of two such steps can translate into a significant cost savings.

Figure 10:
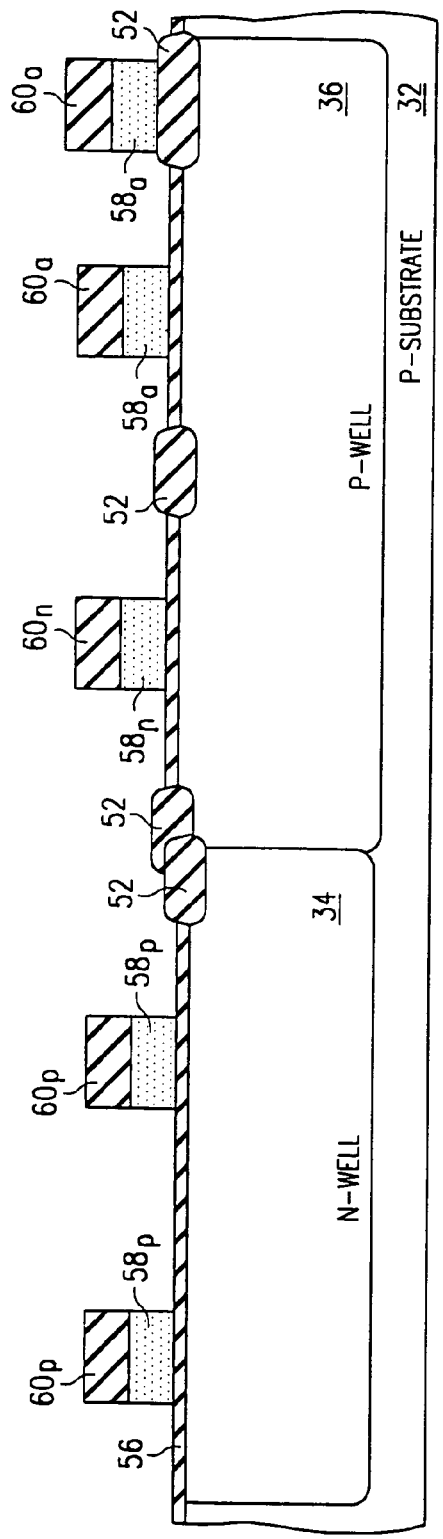

After implanting ions to control the threshold voltage of the memory array, a gate oxide 56 is formed. This step is shown in FIG. 10. Transistor gates 58 are then formed. For purposes of illustration, the gates of the p-channel periphery transistors are labeled with reference numeral 58$p$, the gates of the n-channel periphery transistors are labeled with reference numeral 58$n$, and the gates of the memory cell array transistors are labeled with reference numeral 58$a$. In this discussion, reference to gates 58 will refer to any or all of the gates 58$p$, 58$n$ and/or 58$a$.

To form the gates 58, a layer of undoped polysilicon can be blanket deposited followed by a blanket deposition of an insulating layer 60 (e.g., an oxide such as SiO$_2$). These two layers can then be patterned and etched to form gates 58 and overlying insulating region 60. In the preferred embodiment, gate layer 58 is about 100 nm thick and insulating layer 60 is about 200 nm thick. Oxide 60 behaves as a protective film against etching during later processes such as when the bit line contact and the storage node electrode contact are formed (in FIGS. 15 and 16, for example).

Figure 11:
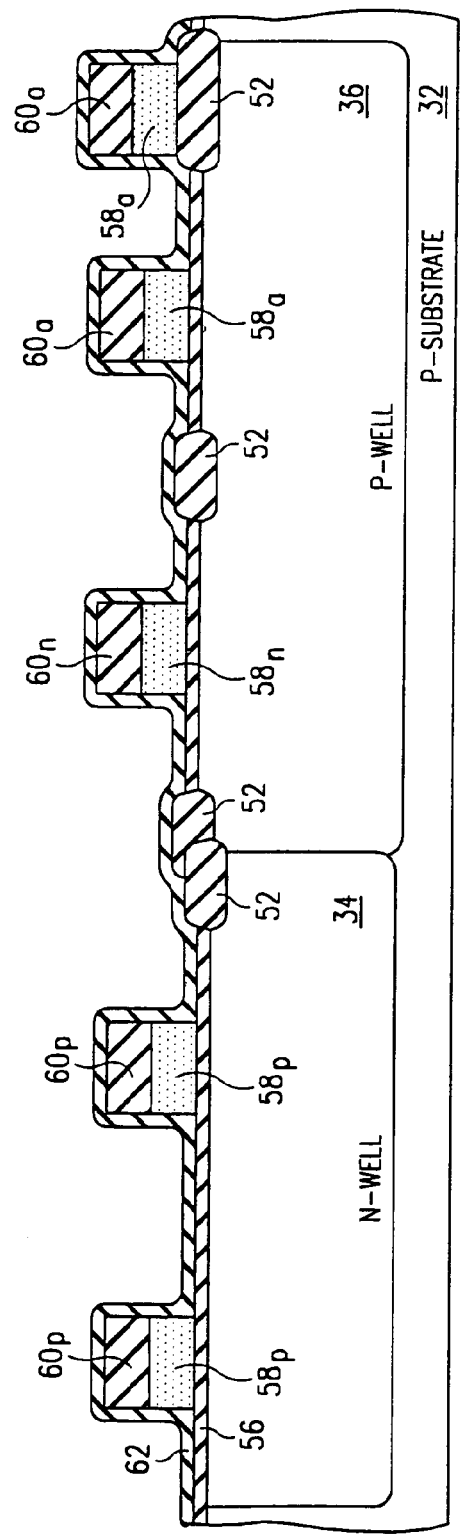
Figure 12:
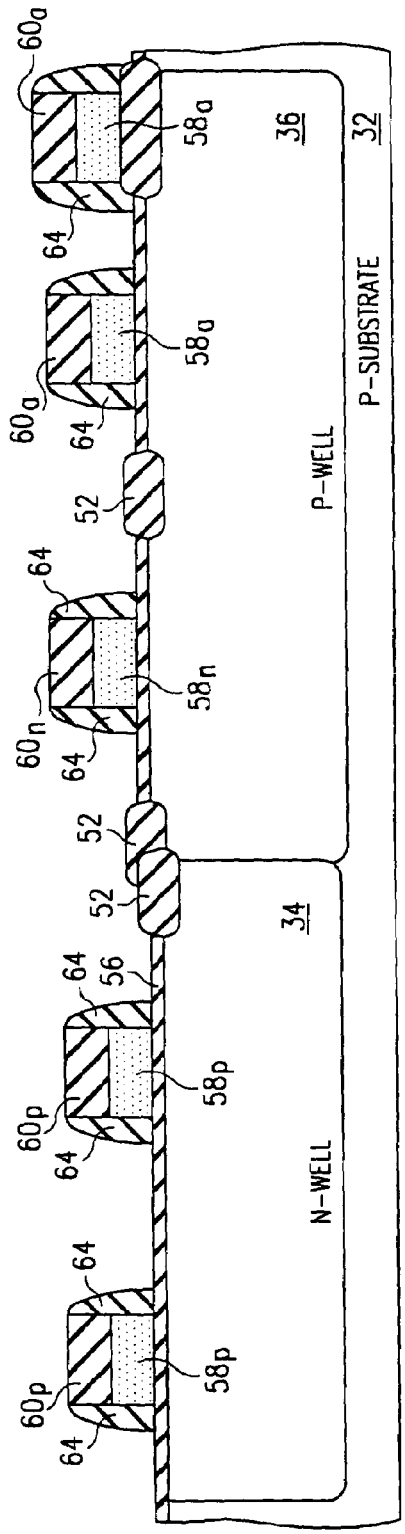

Referring to FIGS. 11 and 12, thin sidewall regions 64 are formed along the sidewalls of gate 58. In this process an insulating film 62 is deposited on the polysilicon gate 58 (as well as an insulating region 60). In the preferred embodiment, an oxide layer 62 is deposited to a thickness of about 30 nm. The insulating film 62 is then anisotropically etched to form sidewall region 64.

Figure 13:
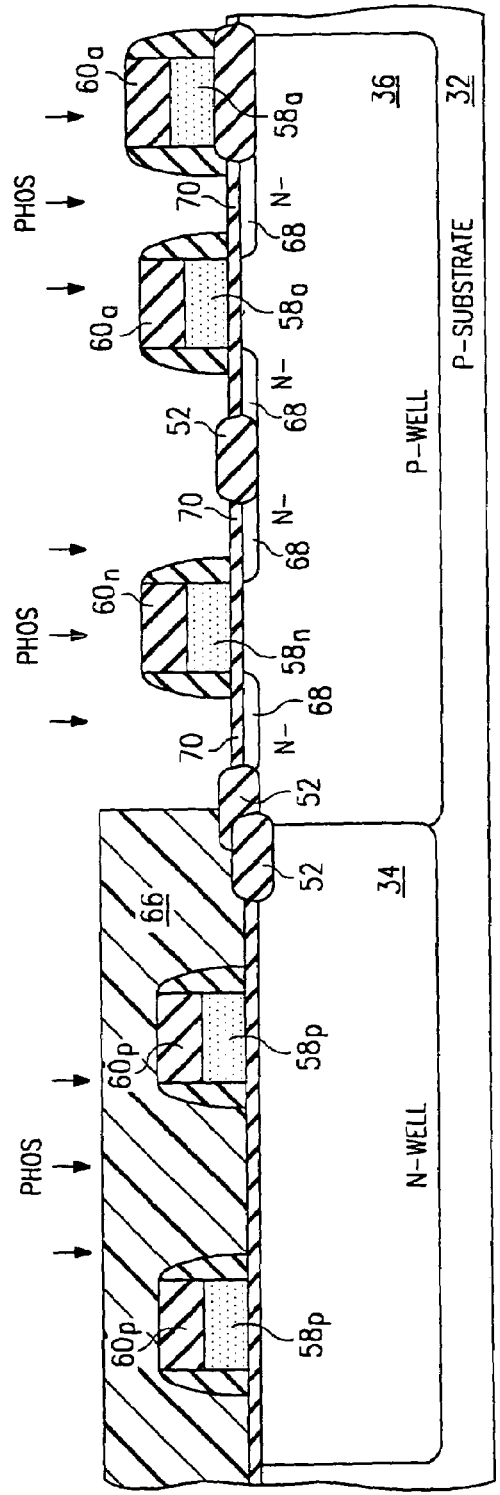

Referring next to FIG. 13, n-type lightly doped drain (LDD) regions 68 are formed. After the n-well region 34 is masked with resist layer 66, n-type dopants (e.g., phosphorus or arsenic) are implanted into source/drain regions 68. A thin oxide film 70 is formed before implanting ions.

Figure 14:
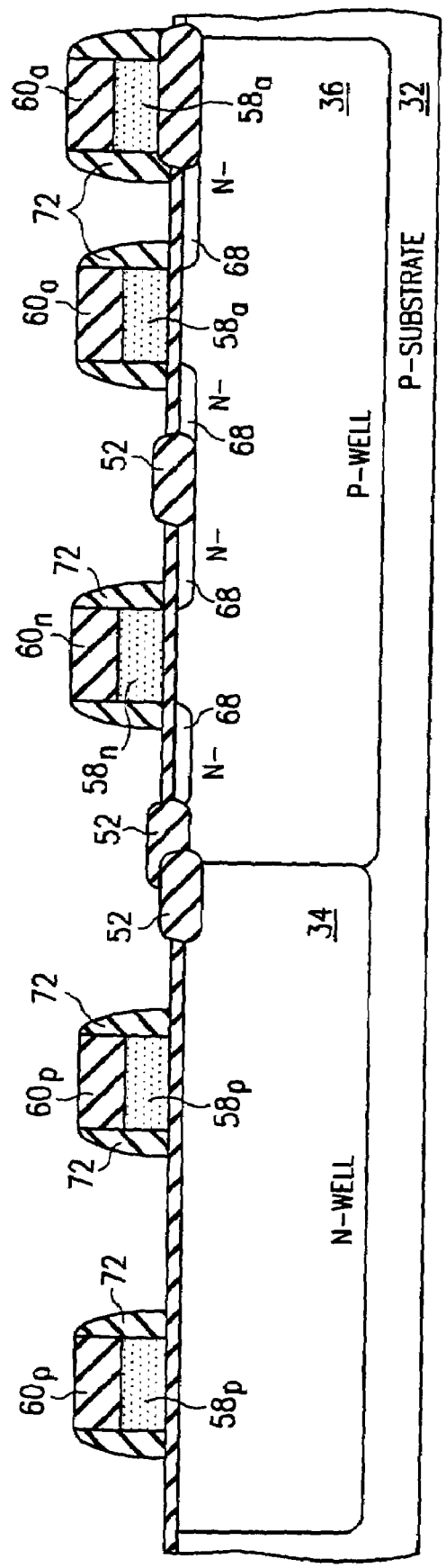

As illustrated in FIG. 14, sidewall regions 72 are formed along the sidewall of gates 58 (as well as along insulating region 60). As with sidewall region 64 illustrated in FIGS. 11 and 12, an insulating layer is blanket-deposited over the device and then anisotropically etched to form the sidewall regions 72. In a preferred embodiment, the deposited insulating layer comprises a 100 nm oxide layer. In other embodiments, nitride sidewall layers can be used.

Figure 15:
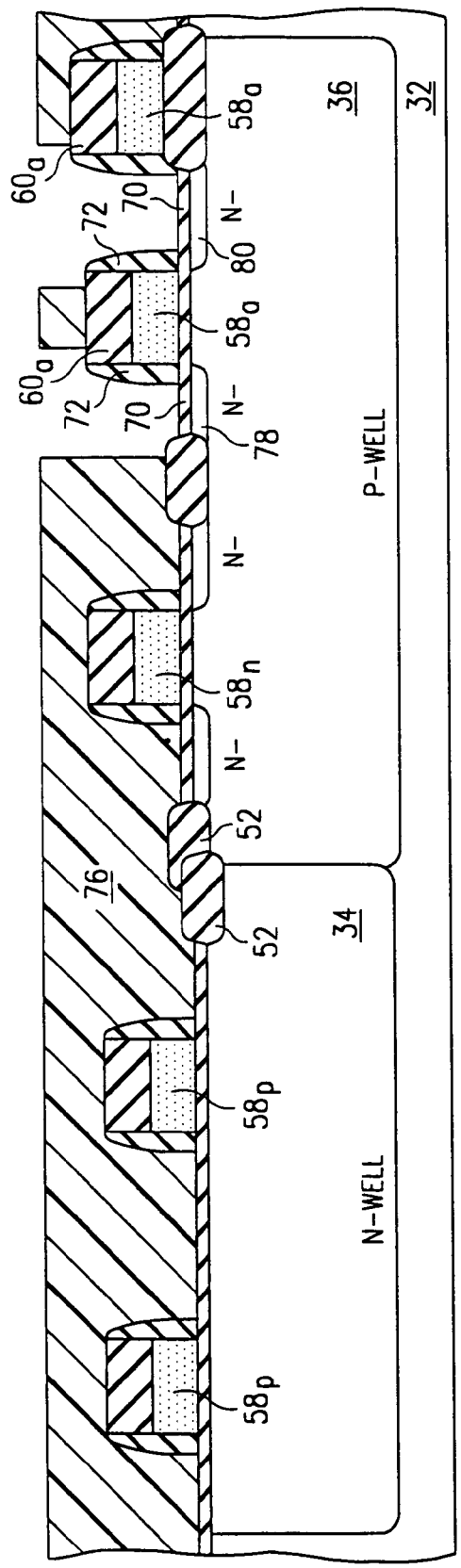
Figure 16:
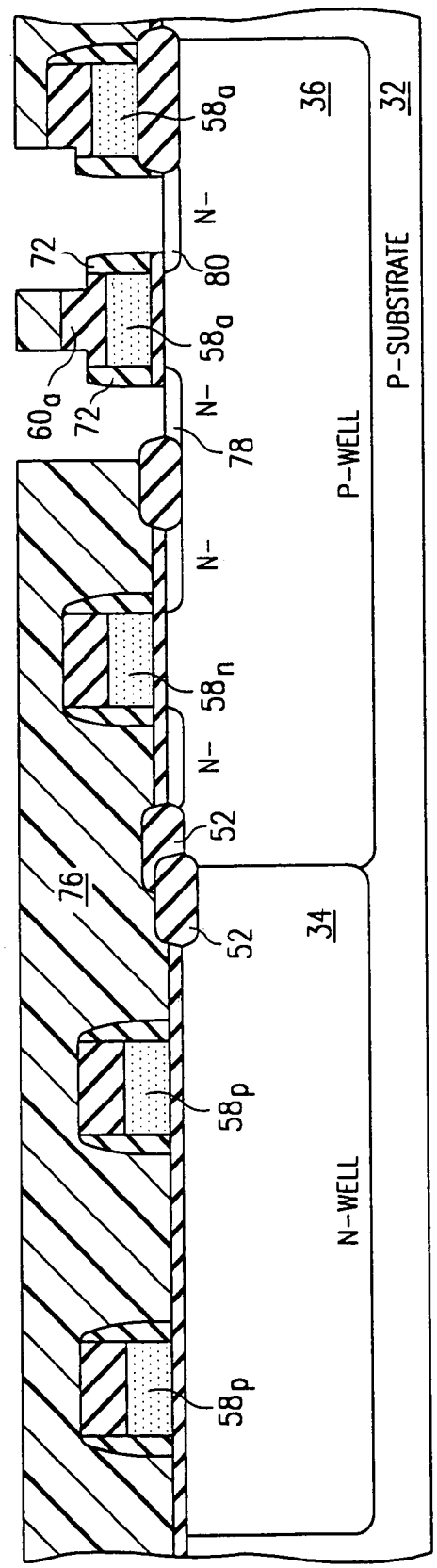
Figure 17:
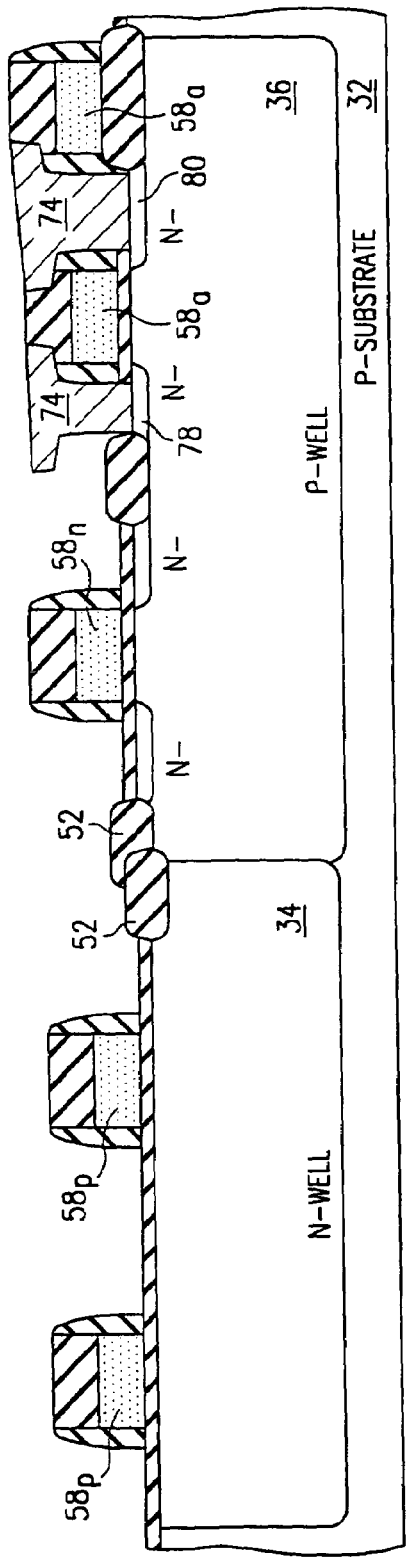

Next, in order to form cells in the memory array, a pad polysilicon 74 is formed at the bit line contact 78 and the storage node electrode contact 80. One process for performing these steps is shown in FIGS. 15-17. Note that pad polysilicon 74 is only one approach among several that may be used to establish contact.

In FIG. 15, a resist layer 76 is patterned so as to expose the bit line contact region 78 and the storage node contact region 80 within p-well 36. The insulating layer 70 over those regions is then removed as shown in FIG. 16. The removal of this portion of insulating layer 70 also thins the exposed portion of insulating layer 60a. Polysilicon (or another conductor such as a metal like tungsten) can then be formed within the via formed by resist layer 76. Once the resist is removed, the pad regions 74 remain as illustrated in FIG. 17.

Note that the shape of the pad region in FIG. 17 differs from the patterned via in FIG. 16. Photoresist 76 in FIG. 16 is patterned as if bit line contact implant region 78 were at the edge of the memory cell array, whereas the bit line contact 74 in FIG. 17 is shown as if the contact were within the array (i.e. not at the edge).

In an alternate embodiment, a self-aligned contact etch process can be used to form the bit line and storage node contacts. Consider for example, the situation where an oxide region is formed over the contact areas 78 and 80. If nitride sidewalls 72 are used, the etchant can be selected so that the oxide over the contact regions 78 and 80 is removed without significantly affecting the nitride sidewalls 72. The process allows for the formation of a contact hole which is smaller than the minimum photolithographic distances.

Bit line contact region 78 and storage node contact region 80 can be heavily doped by diffusion of impurities from the contact regions 74. For example, in one embodiment contact regions 74 comprise n-doped polysilicon. If the device is heated, n-type impurities diffuse from contact regions 74 into the contact regions 78 and 80. In other words, a source and a drain region for each array transistor can be formed diffusing impurities from an overlying polysilicon region 74 into the source and drain regions.

Figure 18:
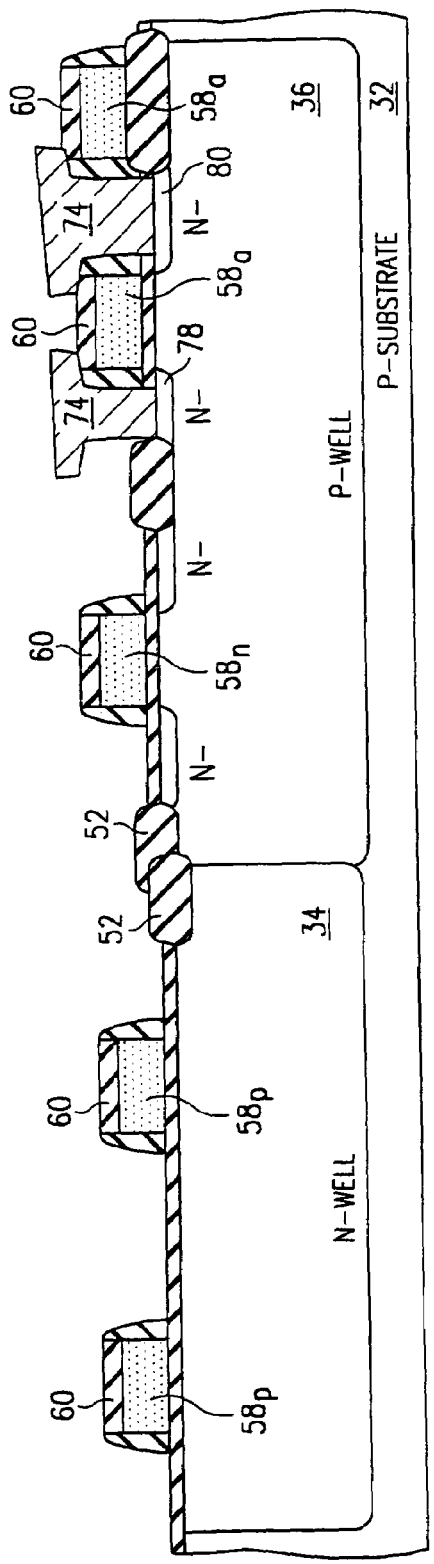

Referring now to FIG. 18, insulating region 60 over the gate 58 is etched back. In the preferred embodiment, oxide region 60 is thinned from about 200 nm to between about 30 nm and 70 mm.

Figure 19:
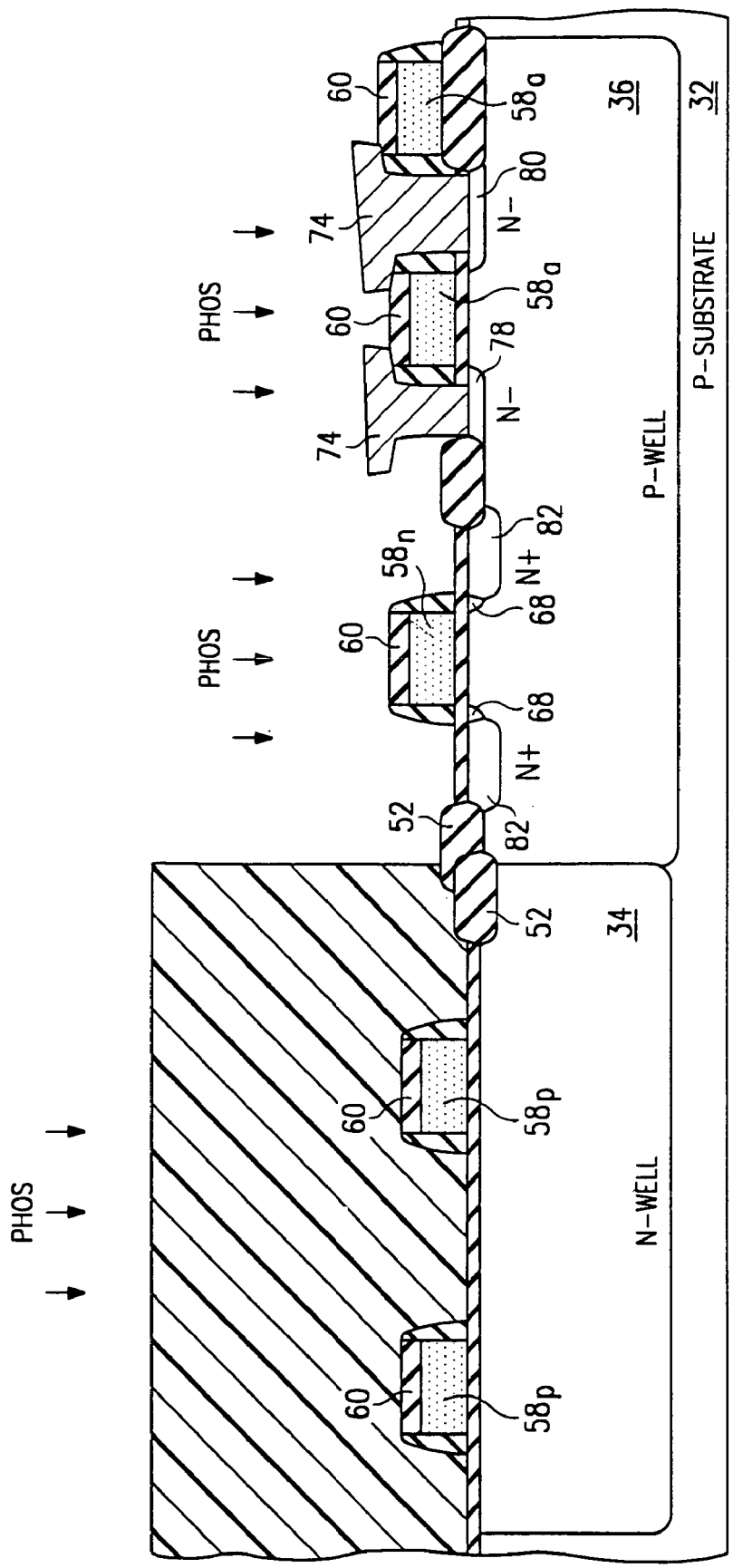

Referring now to FIG. 19, the source/drain regions 82 of the n-channel peripheral transistors can be formed. For example, source/drain regions 82 of the n-channel transistors can be formed by ion implantation of phosphorus (or arsenic). Simultaneously, the undoped polysilicon gate 58n is doped through the thinner oxide film 60n by this ion implantation. Also, the undoped polysilicon gates 58a within the cell array are doped through the thinner oxide film 60a by this ion implantation.

Figure 20:
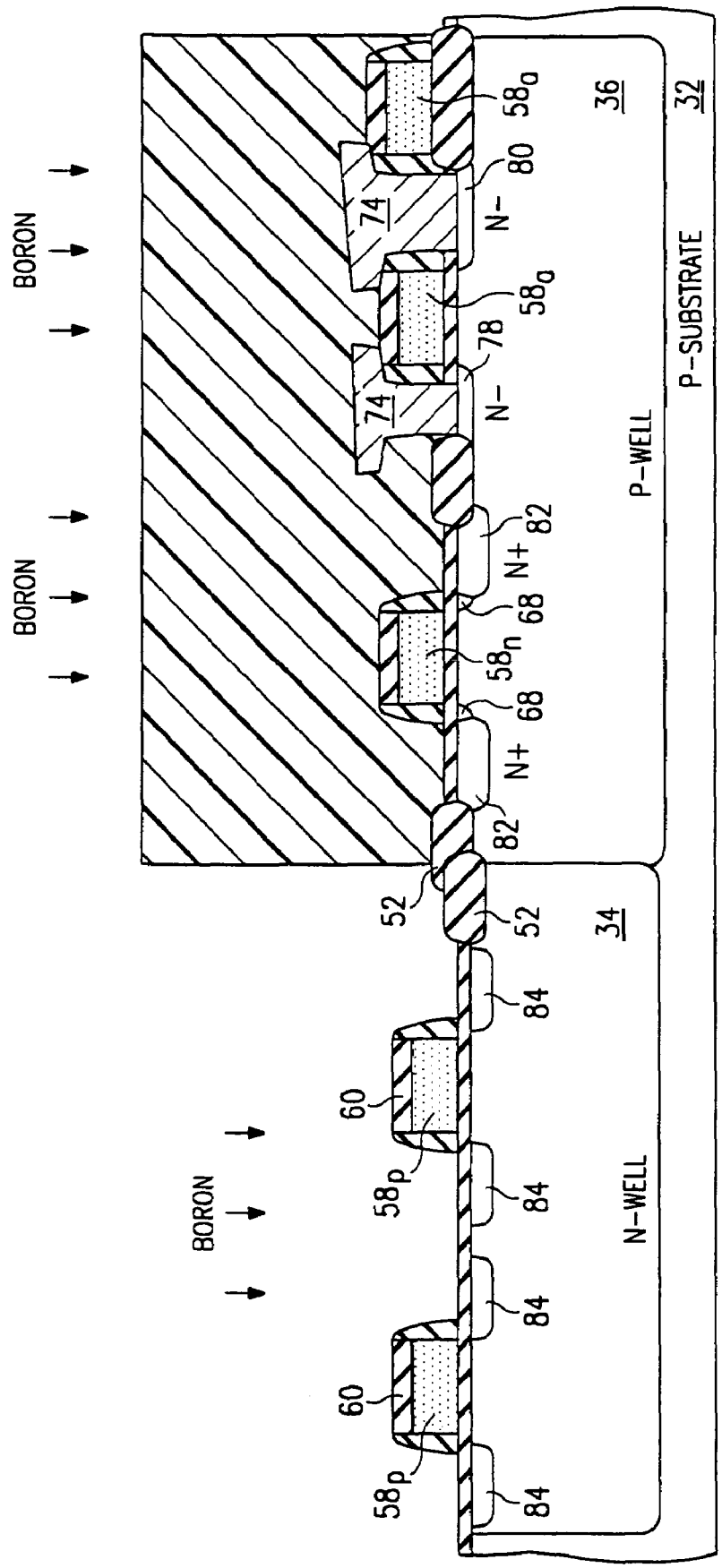

Similarly, the source/drain regions 84 of the p-channel peripheral transistors can be doped by ion implantation of boron (or another p-type dopant) as shown in FIG. 20. During this step, the undoped polysilicon gate 58p is simultaneously doped through the thinner oxide film 60p by this ion implantation.

In this manner, the present invention provides a method for forming surface channel type transistors in both the n-type and p-type peripheral circuits. This process eliminates the need for threshold adjustment implants in the p-channel peripheral circuits, thereby eliminating costly masking steps.

Summarizing one aspect, the present invention provides a method of forming a memory device including array and peripheral circuitry. A plurality of undoped polysilicon gates 58 are formed. These gates 58 are grouped into three groups, namely, first conductivity type peripheral gates 58p, second conductivity type peripheral gates 58n and array gates 58a. The array gates 58a and the first conductivity type peripheral gates 58n are masked such that the second conductivity type peripheral gates 58p remain unmasked. A plurality of second conductivity type peripheral transistors can then be formed by doping each of the second conductivity type peripheral gates 58p while simultaneously doping a first and a second source/drain region 84 adjacent each of the second conductivity type peripheral gates 58p. The second conductivity type peripheral gates 58p are then masked such that the first conductivity type peripheral gates 58n remain unmasked. As before, a plurality of first conductivity type peripheral transistors are formed by doping each of the first conductivity type peripheral gates 58n while simultaneously doping a first and a second source/drain region 82 adjacent each of the first conductivity type peripheral gates 58n.

FIG. 21 shows the memory device after a number of other processing steps. In particular, a bit line 86 has been formed. In addition, a storage capacitor including storage node electrode 88, capacitor dielectric 90 and cell plate electrode 92 has been formed. Any number of processes can be used to form the remainder of the memory device.

The making and use of the various embodiments are discussed above in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a memory device, the method comprising the steps of:
   forming an n-well and a p-well in a semiconductor substrate;
   forming a gate insulating layer over the semiconductor substrate;
   forming a layer of undoped polysilicon over the gate insulating layer;
   forming an insulating film over the undoped polysilicon layer;
   patterning the undoped polysilicon layer and the insulating film to form a first, second, and third plurality of undoped polysilicon gates each having an overlying insulating region;

forming a side wall insulating region along the sidewalls of each of the first, second, and third plurality of undoped polysilicon gates;

etching the overlying insulating regions to form a thinner insulating film over each of the first, second, and third plurality of undoped polysilicon gates;

forming n-doped source/drain regions adjacent the first plurality of undoped polysilicon gates and simultaneously doping each of the first plurality of undoped polysilicon gates and the second plurality of undoped polysilicon gates through the thinner insulating films to form a first and a second plurality of doped polysilicon gates, and forming p-doped source/drain regions adjacent the third plurality of undoped polysilicon gates and simultaneously doping each of the third plurality of undoped polysilicon gates through the thinner insulating films to form a third plurality of doped polysilicon gates.

2. The method of claim 1 and further comprising the step of forming a plurality of isolation regions to isolate active areas within the semiconductor substrate.

3. The method of claim 2 wherein the step of forming a plurality of isolation regions comprises forming field oxide regions by the local oxidation of silicon.

4. The method of claim 3 and further comprising the step of implanting n-type dopants into the n-well and implanting p-type dopants into the p-well.

5. The method of claim 1 and further comprising the step of implanting dopants into the semiconductor substrate beneath the second plurality of undoped polysilicon gates, the implanting step being performed before the formation of the second plurality of undoped polysilicon gates.

6. The method of claim 1 wherein no threshold voltage adjust implantation step is performed in the n-well beneath the third plurality of polysilicon gates.

7. The method of claim 1 and further comprising the step of forming an n-doped layer by implanting ions into the p-well adjacent to each of the second plurality of gates.

8. The method of claim 1 and further comprising the step of forming a pad polysilicon region abutting the semiconductor substrate adjacent to each of the second plurality of doped polysilicon gates.

9. The method of claim 8 and further comprising the step of forming source/drain regions adjacent to each of the second plurality of doped polysilicon gates by diffusing impurities from the pad polysilicon region.

10. The method of claim 1 wherein the step of forming n-doped source/drain regions comprises implanting phosphorus dopants.

11. The method of claim 1 wherein the doping of the third plurality of undoped polysilicon gates occurs before doping the first plurality of undoped polysilicon gates.

12. The method of claim 1 and further comprising the steps of:

forming a storage node electrode electrically coupled to a storage node contact region within the substrate adjacent to each of the doped polysilicon gates within the second plurality of doped polysilicon gates;

forming a capacitor dielectric over the storage node electrode; and forming a plate electrode over the capacitor dielectric.

13. The method of claim 12 wherein the method of forming a memory device comprises a method of forming a DRAM device with at least 64 million memory cells.

14. The method of claim 1, wherein the third plurality of undoped polysilicon gates are masked off during the formation of n-doped source/drain regions and the simultaneous doping of each of the first and second plurality of undoped polysilicon gates.

* * * * *